(12) United States Patent
Aubert (10) Patent No.: US 7,786,730 B2
(45) Date of Patent: Aug. 31, 2010

(54) NMR MACHINE COMPRISING SOLENOID GRADIENT COILS WHICH ARE INCORPORATED INTO TUBES

(75) Inventor: Guy Aubert, Poitiers (FR)

(73) Assignee: Commissariat A l'Energie Atomique Et Aux Energies Alternatives, Paris (FR)

( * ) Notice: Subject to any disclaimer, the term of this patent is extended or adjusted under 35 U.S.C. 154(b) by 10 days.

(21) Appl. No.: 12/084,082

(22) PCT Filed: Oct. 26, 2006

(86) PCT No.: PCT/FR2006/051116

§ 371 (c)(1),
(2), (4) Date: Apr. 24, 2008

(87) PCT Pub. No.: WO2007/048984

PCT Pub. Date: May 3, 2007

(65) Prior Publication Data

US 2009/0096451 A1    Apr. 16, 2009

(30) Foreign Application Priority Data

Oct. 26, 2005    (FR) .................................. 05 10951

(51) Int. Cl.
*G01V 3/00* (2006.01)
(52) U.S. Cl. ...................................... 324/318; 324/319
(58) Field of Classification Search ................. 324/318, 324/319, 322
See application file for complete search history.

(56) References Cited

U.S. PATENT DOCUMENTS

| 5,530,355 | A | 6/1996 | Doty | |
| 7,403,009 | B2 * | 7/2008 | Aubert | ........................ 324/318 |
| 7,468,644 | B2 * | 12/2008 | Axel | ........................... 333/219 |
| 2002/0105329 | A1 | 8/2002 | Heid et al. | |

FOREIGN PATENT DOCUMENTS

| EP | 0 681 189 A1 | 11/1995 |
| WO | WO 2005/029110 A2 | 3/2005 |

* cited by examiner

*Primary Examiner*—Louis M Arana
(74) *Attorney, Agent, or Firm*—Weingarten, Schurgin, Gagnebin & Lebovici LLP (57) ABSTRACT

The nuclear magnetic resonance machine comprises a device (101) for creating an intense main magnetic field $B_0$ in a usable interior space (109) in the form of a tunnel with axis Z, a radio-frequency excitation device that also processes radio-frequency signals emitted in response by a body (150) placed in the usable interior space (109), and a set (110) of solenoidal gradient coils for superimposing on the intense magnetic field $B_0$ components of a additional magnetic field, the gradient coils (111-122) being incorporated into tubes disposed in an annular cylindrical space (130). Between an exterior cryogenic enclosure (102) and the annular cylindrical space (130) a cylindrical screen (104) is disposed along the axis Z comprising a conductive material of low resistance and low magnetoresistance such that negligible induced currents are generated in the exterior cryogenic enclosure (102) while the eddy currents induced in the cylindrical screen (104) contribute to reinforcing the gradients produced by the solenoidal gradient coils (111-122).

25 Claims, 4 Drawing Sheets

NMR MACHINE COMPRISING SOLENOID GRADIENT COILS WHICH ARE INCORPORATED INTO TUBES

This application is a §371 national phase filing of PCT/FR2006/051116 filed Oct. 26, 2006, and claims priority to French application No. 05 10951 filed Oct. 26, 2005.

The present invention relates to nuclear magnetic resonance (NMR) machines comprising solenoidal gradient coils which are incorporated into tubes, and more particularly to NMR machines that compensate eddy currents generated by the gradient coils.

The invention relates generally to NMR machines that can be used for magnetic resonance imaging (MRI) in the medical field in particular.

NMR machines can have a tunnel-type structure with a central space reserved for the patient and an annular structure that has to integrate, firstly means for creating an intense main magnetic field $B_0$ in the central observation space, these means generally consisting of a superconductor main magnetization coil placed in a cryostat, or where appropriate a permanent magnet, and, secondly radio-frequency excitation means (transmit antennas) and means for processing radio-frequency signals re-emitted in response to radio-frequency excitation sequences by the body of a patient placed in the central observation space.

To be able to distinguish between the radio-frequency signals re-emitted in response to radio-frequency excitation sequences and to create an image, gradient coils superimpose additional magnetic fields on the intense main field, which is homogeneous, the additional magnetic fields being of values that are a function of the 3D coordinates of the points at which they are applied.

This function conventionally uses three orthogonal axes X, Y, Z with the Z axis being generally collinear with the intense field $B_0$. Each point in space can thus be "coded" with a different field value and the resulting modifications in the re-emitted signal can be processed to produce the image.

Acquiring an image therefore requires conjoint application of field gradient sequences during application of the radio-frequency excitation sequences. Whichever imaging method is adopted, one characteristic of field gradients is that they are pulsed.

Diverse examples of gradient coil systems for NMR machines are given in patent documents FR 2 588 997 and FR 2 621 125, for example. For high-quality NMR imaging, the real field gradients must be homogeneous, i.e. must conform, with a given tolerance, to a theoretical ideal distribution that is to be imposed. To increase the homogeneity of the gradients produced, the gradient coils must be as large as possible, but for reasons of overall size and power the size of these gradient coils must also not be unduly increased, which means that designing these gradient coils is subject to contradictory requirements.

Moreover, the temporary character of the gradient pulses also makes it necessary to solve problems linked to the pulsed nature of the field, over and above the problem of the linearity of the field that these gradient coils produce.

Thus for NMR machines with a high-intensity orientation field, in particular, it is necessary to have detectable high-frequency NMR signals, for example signals at a frequency of the order of 426 megahertz (MHz) for NMR machines operating at around 10 teslas. The gradient coils must then be able to produce a gradient slope of the order of 100 milliteslas per meter (mT/m) to 150 mT/m, for example.

These more powerful gradients give rise to problems of various types. Firstly, the power dissipation of gradient coils capable of producing such slopes is very high: of the order of a few tens of kilowatts (kW). It is therefore necessary to provide efficient cooling so that these gradients do not overheat the patient and the cryostat containing the superconductor main magnetization coil.

Moreover, fast imaging sequences used at present include gradient pulses of duration that is of the order of a few milliseconds (ms) and of rise and fall times that must be 1 ms or less.

With the electrical powers employed, the gradient coils, located in the orientation field of the machine, are subjected to very violent accelerations caused by electromagnetic forces. Those accelerations quickly cause the machine to deteriorate and also produce noise that is intolerable for the patient who is being examined. The noise constraint is moreover particularly difficult when, in order to examine the brain in particular, the aim is to show up those areas of the brain that are stressed during some particular intellectual activity. It is then difficult to ask a patient to undertake some particular intellectual activity (for example mentally doing operations of addition or multiplication) at the same time as submitting them to a frightening noise that prevents them from concentrating.

Even if this type of experiment could be envisaged on humans, pre-clinical experiments on animals are not possible if the animals are stressed by such noise.

All these problems must be solved allowing for the fact that, to leave a sufficiently large usable examination volume, the overall size of the gradient coils is limited. For example, it should be recalled that because it is now standard practice in this field, the usable examination volume is located in a tunnel of circular section having a diameter that must have a value of approximately 550 millimeters (mm), the gradient coils having to fit into an annular space between this usable tunnel volume and the volume inside the panels of the cryostat. This volume inside the cryostat constitutes a circular tunnel with a diameter of approximately 1000 mm.

Patent document U.S. Pat. No. 5,530,355 discloses an NMR machine that, in order to produce the gradients, uses windings of axes that are generator lines of a cylinder of axis corresponding to the direction of the main magnetic field. For improved linearity, the above document nevertheless teaches the use of windings other than solenoidal coils, which makes their implementation more complex.

To produce gradients whilst taking the above problems into account, patent document WO2005/029110 has already proposed dedicating the available annular space to accommodating tubes into which circular solenoidal coils are inserted. The tubes are preferably contiguous with one another and form a layer of tubes.

Disposing the coils in the tubes yields the intended result of producing high-intensity gradients, as a result of enhanced cooling, conformance to linearity constraints imposed by specifications, reduced acoustic noise, and limitation of eddy currents.

The elimination of noise is a result of inserting the solenoidal coils into tubes with axes parallel to the main field and loading them only radially relative to their own structure, the torsor that results from the electromagnetic stresses being zero.

Having a field orientation perpendicular to the standard gradient coils, the proposed structures, in particular those for the X and Y gradients, produce much lower eddy currents in the screens or the various metal panels of the cryostat than previous implementations.

However, these eddy currents can continue to constitute a problem in certain circumstances, in particular by overheating the cryostat, which increases the consumption of cryogenic fluid.

Moreover, disposing standard screens between gradient generators and the cryostat of the main magnet reduces the electric fields produced outside the screens by the gradient generators.

However, reducing the induced currents in this way makes the gradients less effective and makes it even more difficult to produce intense gradients with fast switching in an intense main field.

Thus patent documents EP 0 681 199 and US 2002/0105329 disclose the use of a passive screen made from a material that is a good conductor, such as copper or aluminum, to protect the superconductor main magnet from the varying magnetic fields of the gradient generators, but this has the drawback that the intensity of the gradients is weakened and the linearity of the gradients and the waveform of the gradient pulses are significantly degraded.

An aim of the invention is therefore to overcome the drawbacks referred to above and in particular to reduce the drawbacks linked to the creation of eddy currents by the gradient generators.

According to the invention, this object is achieved by a nuclear magnetic resonance machine comprising means for creating an intense main magnetic field $B_0$ in a usable interior space in the form of a tunnel with axis Z, means for radio-frequency excitation and for processing radio-frequency signals emitted in response by a body or object placed in said usable interior space, and a set of solenoidal gradient coils for superimposing on the intense magnetic field $B_0$ components of an additional magnetic field, said gradient coils being incorporated into tubes disposed in an annular cylindrical space situated between an exterior cryogenic enclosure containing said means for creating an intense magnetic field $B_0$ and said usable interior space, the diameter of the gradient coils being inscribed in a thickness of said annular cylindrical space, the solenoidal gradient coils being adapted to produce a first field gradient X in a first radial direction x of the machine perpendicular to the axis Z and a second field gradient Y in a second radial direction y of the machine also perpendicular to the axis Z, the first direction x being perpendicular to the second direction y, and the machine including amplifiers for simultaneously energizing said solenoidal coils with algebraic sums of currents corresponding to the two gradients, characterized in that a solenoidal coil whose diameter is inscribed in the cylindrical annular space and that produces a field gradient Z in a direction z parallel to the main field $B_0$ is coaxial with another solenoidal coil inscribed in the same tube of this annular cylindrical space and producing a field gradient X in a direction x perpendicular to the direction z, in that it further comprises between said exterior cryogenic enclosure and said annular cylindrical space a cylindrical screen along the axis Z comprising a conductive material cooled to a temperature less than or equal to 77 kelvins (K) and chosen to have resistivity less than or equal to $10^{-8}$ Ω·m such that negligible induced currents are generated in the exterior cryogenic enclosure while the eddy currents induced in the cylindrical screen contribute to reinforcing the gradients produced by said solenoidal gradient coils.

In contrast to conventional screens, the cylindrical screen of the invention does not attenuate the induced currents, but causes them to appear in a controlled and accurately-calculable manner in the long, thick, and cylindrical screen that is a good conductor and has an axis collinear with the axis Z of the main field $B_0$.

The cylindrical screen can be of aluminum, copper, or a superconductor material.

The conductive cylindrical screen is cooled to a temperature of 77 K or less (the temperature of liquid nitrogen) or preferably to a temperature in the range 20 K to 40 K. This temperature range can be obtained by recycling helium vapor used in the cryostat, for example.

In one particular embodiment, the cylindrical screen of conductive material is disposed between first and second cylindrical glassfiber-reinforced epoxy walls, the cylindrical screen being held in position relative to the first and second cylindrical walls with the aid of localized insulative supports.

The cylindrical screen preferably has a thickness in the range 5 mm to 15 mm, which is advantageous.

According to an advantageous feature, which in particular provides more room for the shoulders of a patient or for instrumentation, the solenoidal gradient coils incorporated in tubes constitute individual sources of X, Y and Z gradients that are dimensioned as forming part of a set of N contiguous individual sources distributed at the perimeter of the cylindrical annular space, where $N=4υ$, $υ$ being an integer greater than or equal to 2, but where one in two individual sources is omitted so as to retain only $2υ$ non-contiguous individual sources, each tube being provided with one individual source.

If it is not necessary to provide more room for the shoulders of a patient, in one possible embodiment, the solenoidal coils are distributed at the perimeter of the annular space in 2n arrangements of coaxial solenoidal coils where $\underline{n}$ is an integer greater than or equal to 3, preferably in the range 4 to 9.

In another possible embodiment, the circular solenoidal coils are distributed at the perimeter of the annular space in 2n arrangements of coaxial solenoidal coils, a plurality of coils being energized simultaneously by combinations of currents to produce an X and/or Y and/or Z gradient, $\underline{n}$ being an integer greater than or equal to 3, preferably in the range 4 to 9.

In one embodiment, a component of a current that flows in a coil to produce a gradient is proportional to a nominal current multiplied by the cosine of an angle that identifies the coil on the perimeter of the annular space.

In another embodiment, a component of a current that flows in a coil to produce a gradient is proportional to a nominal current multiplied by a coefficient of 1, 0.732, or 0.268 as a function of an angle that identifies the coil on the perimeter of the annular space.

In one particular embodiment, the annular space has contiguous tubes distributed at its perimeter to receive the solenoidal coils, the radius $\underline{a}$ of a tube being given by $a=r1(\sin \pi/N)/(1-\sin \pi/N)=r2(\sin \pi/N)/(1+\sin \pi/N)$, where N represents the number of tubes and r1 and r2 the inside and outside radii, respectively, of the annular space.

Solenoidal coils are energized by individual electrical power supplies.

The solenoidal coils are advantageously formed of elongate helicoidal turns, preferably of rectangular profile, along circular conductive sleeves, sleeves of the same coil being concentric and engaged one within another.

There is then preferably an annular space for cooling fluid between two sleeves.

In one particular embodiment, the portion of the field gradients produced in directions (x, y) perpendicular to the axis $\underline{z}$ by the eddy currents induced in the cylindrical screen is determined by an electromagnetic calculation technique such as a finite element technique.

Other features and advantages of the invention emerge from the following description of particular embodiments, given by way of example with reference to the appended drawings in which.

Figure 1:
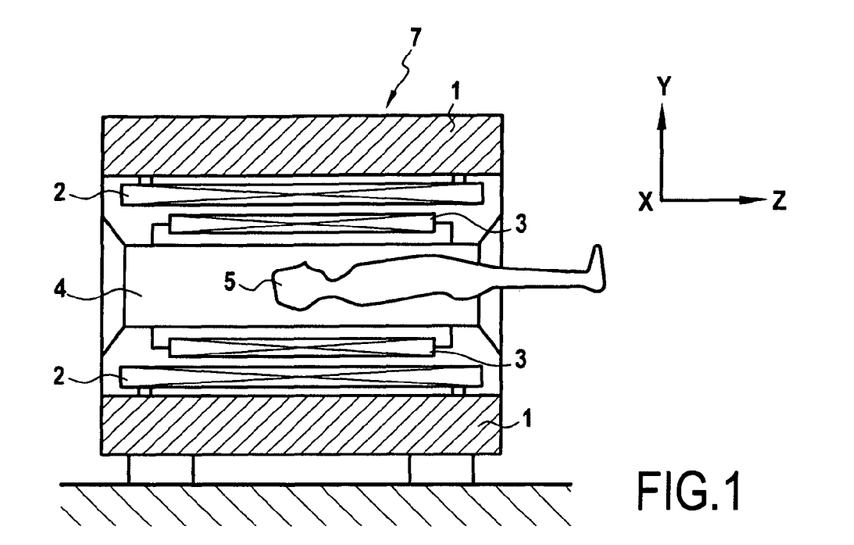
FIG. 1 is a diagram showing an NMR machine in longitudinal section.

FIG. 1 shows very diagrammatically the theory of an NMR machine 7 with a device 1 for creating a homogeneous and intense main magnetic field $B_0$ essentially parallel to the axis Z of a tunnel 4 in which a patient 5 is placed.

The device shown in FIG. 1 for creating an intense main magnetic field $B_0$ can comprise permanent magnets. However, this device may preferably comprise a superconductor magnet placed in a cryostat intended to maintain the superconductor magnet at a very low temperature. In any event, the device 1 for creating an intense magnetic field is placed in a cylindrical annular external enclosure that provides an annular space between the inside wall of this external enclosure and the tunnel 5 in which the patient 5 to be examined is placed. The cylindrical annular external enclosure generally has metal walls, for example stainless steel walls.

In this annular space situated inside the device 1 for creating an intense main magnetic field there are disposed gradient coils 2 intended to create magnetic field gradients both in the direction of the axis Z of the tunnel 4 and in directions X and Y perpendicular to each other and to the axis Z.

As indicated above, the gradient coils 2 provide a way of coding the space in which the patient 5 is placed by applying pulsed additional magnetic fields.

The components of these magnetic fields that are not oriented like the orientation field $B_0$ have only a second order contribution to the modification of the usable NMR signal (and therefore a negligible contribution with the values of $B_0$ and the gradients considered here). Thus the only component of the magnetic fields produced by the gradient coils that is of interest and useful is the component oriented along the field $B_0$. This usable component is usually referred to as the Bz or $B_z$ component. The coordinates of points inside the machine are defined relative to a Cartesian system of axes, the axis $\underline{z}$ being collinear with the direction of the uniform field $B_0$ and parallel to the generator lines of the tunnel machine. Depending on the sets of gradient coils that are energized, the useful component Bz at one location increases in amplitude as a function of the abscissa $\underline{x}$ of a plane containing that location, parallel to the plane yOz for the X gradients, as a function of the ordinate $\underline{y}$ of a plane containing that location, parallel to the plane xOz for the Y gradients, or as a function of the dimension $\underline{z}$ of a plane containing that location, parallel to the plane xOy for the Z gradients.

A system of radio-frequency transmit antennas 3 is disposed in the vicinity of the tunnel 4 in which the patient is placed or inserted directly into the tunnel. The radio-frequency transmit antennas or coils are conventionally associated with devices for receiving and processing radio-frequency signals emitted in response by the body of the patient 5 or by any other object under study, for example an animal.

Figure 2:
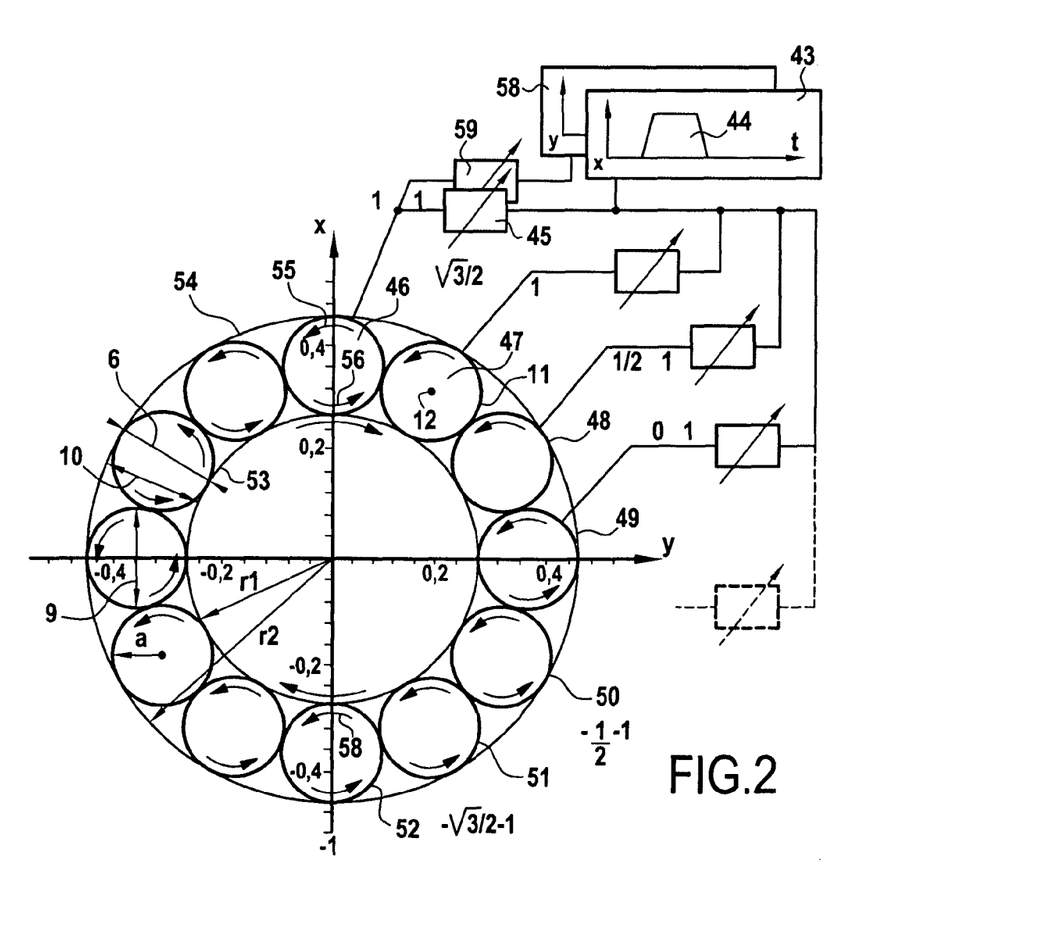
FIG. 2 is a diagram showing an NMR machine to which the invention can be applied in section perpendicular to the axis of the tunnel and the main field.

FIG. 2 shows the cylindrical annular space 6 including circular solenoidal coils whose diameter 9, of value 2a, is inscribed within a thickness 10 of this annular space 6 defined by cylindrical walls 53, 54 having respective radii r1 and r2. It can initially be assumed that the thickness 10 of the annular space 6 is equal to the total thickness of that space. In the example shown, the annular space 6 is therefore occupied by twelve tubes consisting of panels 11 made from a plastics material or some other electrically insulative material. Inside the tubes 11 are coils for producing gradient magnetic fields, which coils can be produced as described in the document WO 2005/029110. The tubes are preferably contiguous with each other.

Each tube can be fitted with a set of coils exactly identical to the set of any other tube. This set of coils is advantageously capable of producing a Z gradient and a gradient in a chosen direction perpendicular to the axis Z. The coils can be controlled to produce gradients of X or Y orientation.

In the example shown, the number of tubes can be even (2n) to produce X or Y gradients and Z gradients. However, one particular embodiment could comprise an even number of first tubes to contain solenoidal coils to produce X or Y gradients and an odd number of second tubes to contain coils to produce Z gradients.

A few basic concepts useful for understanding the invention are explained below.

Note firstly that any point M in space can be identified by its Cartesian coordinates (x, y, z) or its polar coordinates (r, υ, φ), where:

$$\vec{r} = OM \quad r = |\vec{r}|$$

$$x = r \sin\theta \cos\phi$$

$$y = r \sin\theta \sin\phi$$

$$z = r \cos\theta$$

In the volume of interest around the origin O the main field $\vec{B}_0$ is substantially uniform and directed along the following axis Oz:

$$\vec{B}_0 \approx B_0 \vec{u}\, z.$$

In a region of space that is "magnetically" empty (i.e. in which there are no electric currents or materials of non-negligible magnetic susceptibility), each component $B_x$, $B_y$, and $B_z$ has a zero Laplace operator. For example, whatever the sources of the field, $\Delta B_z = 0$ and $B_z(\vec{r})$ has a unique expansion in spherical harmonics of the form:

$$B_z(r, \theta, \varphi) = Z_0 + \sum_{n=1}^{\infty} r^n \left[ Z_n P_n(\cos\theta) + \sum_{m=1}^{n} (X_n^m \cos m\varphi + Y_n^m \sin m\varphi) W_n^m P_n^m(\cos\theta) \right]$$

In the above equation $W_n^m$ is a numerical weighting factor such that $|W_n^m P_n^m(\cos\theta)| \leq 1$, such as $|P_n(\cos\theta)|$.

This expansion is valid only for $r < r_{max}$, the radius of the largest "magnetically" empty sphere with center O. The coefficients of degree $\underline{n}$ ($\underline{m}$ is referred to as the order) are of the form $\alpha_{r_{max}}^{-n}$ where $\alpha$ has the dimension of a field and the rate of convergence of the expansion is proportional to the difference between $\underline{r}$ and $r_{max}$.

Producing images from NMR signals requires three dimensional space to be coded by means of specific field sources of components $b_z$ that should ideally be of the form $b_z=g_x x$, $b_z=g_y y$, and $b_z=g_z z$, where $g_x$, $g_y$, and $g_z$ are proportional to the excitation currents of their respective sources. They are referred to for short as the x gradient, the y gradient, and the z gradient, respectively.

In practice, such linearity can be achieved only approximately with sources that generate fields $\vec{b}$ with non-zero components $b_x$ and $b_y$. Happily, this does not matter if $|\vec{b}| \ll B_0$, which is practically always so. The resonant frequency is proportional to:

$$|\vec{B}| = \sqrt{(B_0+b_z)^2 + b_x^2 + b_y^2} = B_0\sqrt{1 + 2\frac{b_z}{B_0} + \frac{b^2}{B_0^2}}$$

$$\simeq B_0 + b_z + \frac{b_x^2+b_y^2}{2B_0} + \ldots = B_0 + b_z + B_0 \times O\left(\frac{b}{B_0}\right)^2$$

Thus only the component $b_z$ is operative at the level of the ppm provided that $$\frac{b}{B_0} \leq \sim 10^{-3}.$$

Applied to the production of magnetic field gradients, the principle of symmetry shows that the symmetry properties of the field source concerned lead to zero values of certain coefficients of the spherical harmonic expansion mentioned above, whatever the way in which it might have been produced.

The generation of magnetic field gradients for MRI has produced a considerable body of publications and patents and is still the subject of intensive research. The most modern imaging methods, in particular functional imaging, require gradients that are as linear as possible, that are ever more powerful, and that are switchable very quickly, while the main field in which they are to function is ever more intense. Faced with the corresponding problems of cooling, isolation, and acoustic noise, the active and reactive powers necessary become considerable.

The problems caused by currents induced in conductors in the vicinity of the gradient generators also become ever more difficult to solve.

Of course, all known systems use the results of applying the principle of symmetry. However, it is possible to go much further in canceling certain coefficients of the spherical harmonic expansion by combining individual sources energized by currents linked by appropriate relationships of proportionality.

Consider a current distribution that is antisymmetrical relative to the plane xOz and either antisymmetrical (AA) or symmetrical (AS) relative to the plane xOy.

A simple distribution of this kind consists, for example, of a set of solenoidal coils with the same axis O'z' parallel to the axis Oz, at a distance d therefrom. The Cartesian coordinates for the center O' of this set that is antisymmetrical or symmetrical relative to the plane xOy are (d, 0, 0), with one or the other of the following two configurations:

the set (AA) comprises an even number of solenoidal coils on either side of the plane xOy, the geometrically symmetrical solenoidal coils carrying currents turning in opposite directions about the axis O'z' (the simplest case therefore comprises two antisymmetrical solenoidal coils);

the set (AS) comprises any number of solenoidal coils, the solenoidal coils that are geometrically symmetrical relative to the xOy plane carrying currents turning in the same direction about the axis O'Z' (the simplest case therefore comprises a single solenoidal coil with xOy as the plane of symmetry).

More complex configurations can be envisaged, however, for example coils with non-circular sections and around a plurality of axes O'z'. The only conditions to be complied with are the symmetry properties symbolized by (AA) or (AS).

Consider either of these sets carrying a current I and let P be the corresponding dissipated power.

By direct application of the principle of symmetry, a set (AA) produces in the region of interest a field whose non-zero expansion terms are in the form:

$Z_{2p+1} \; \forall p \geq 0$ $X_n^m \; \forall m \geq 1, n=m+2l+1 \; \forall l \geq 0$ It is shown in the same way that a set (AS) carrying a current I produces in the region of interest a field whose non-zero expansion terms are of the form:

$Z_{2p} \; \forall p \geq 0$ $X_n^m \; \forall m \geq 1, n=m+2l \; \forall l \geq 0$ The following principles can be used to produce a Z gradient generator.

Consider N identical individual sources of type (AA) carrying the same current I and regularly distributed around the axis Oz. The coordinates of the traces O'j of their axes on the plane xOy are therefore:

$$\varphi_j = \varphi_0 + j\frac{2\pi}{N} \; j \in [0, N-1]$$

in which $\phi_0$ is any origin azimuth.

The expansion in terms of spherical harmonics of the component z of the total field produced is the sum of the expansions of type (AA) appropriately offset in azimuth $\phi$:

$$B_z(r,\theta,\varphi) = \sum_{p=0}^{\infty} r^{2p+1} N Z_{2p+1} P_{2p+1}(\cos\theta) +$$

$$\sum_{m=1}^{\infty} \sum_{l=0}^{\infty} r^{m+2l+1} X_{m+2l+1}^m \left[\sum_{j=0}^{N-1} \cos m(\varphi - \varphi_j)\right] W_{m+2l+1}^m P_{m+2l+1}^m(\cos\theta)$$

The sums between square brackets are calculated as follows:

$$\sum_{j=0}^{N-1} \cos m(\varphi - \varphi_j) = \sum_{j=0}^{N-1} \cos\left[m(\varphi-\varphi_0) - j\frac{2m\pi}{N}\right]$$

$$= \left[\sum_{j=0}^{N-1} \cos j\frac{2m\pi}{N}\right] \cos m(\varphi - \varphi_0) +$$

$$\left[\sum_{j=0}^{N-1} \sin j\frac{2m\pi}{N}\right] \sin m(\varphi - \varphi_0)$$

$$= \begin{cases} 0, & m \neq kN \\ N\cos m(\varphi-\varphi_0), & m = kN \end{cases} \forall k \geq 1$$

The expansion of the total field therefore reduces to:

$$B_z(r,\theta,\varphi) = N \begin{bmatrix} \sum_{p=0}^{\infty} r^{2p+1} Z_{2p+1} P_{2p+1}(\cos\theta) + \\ \sum_{k=1}^{\infty}\sum_{l=0}^{\infty} r^{kN+2l+1} X_{kN+2l+1}^{kN} \cos kN(\varphi-\varphi_0) \\ W_{kN+2l+1}^{kN} P_{kN+2l+1}^{kN}(\cos\theta) \end{bmatrix}$$

for a total dissipated power equal to NP.

In practice, it suffices to make N fairly large, for example N=12 or more, so that the contributions of the terms in $r^{kN+2l+1} X_{kN+2+1}^{kN}$ are entirely negligible and the expansion reduces to:

$$B_z(r,\theta,\varphi) = N\sum_{p=0}^{\infty} r^{2p+1} Z_{2p+1} P_{2p+1}(\cos\theta)$$

$$= NZ_1 z + N\sum_{p=0}^{\infty} r^{2p+1} Z_{2p+1} P_{2p+1}(\cos\theta)$$

The linearity of the generator of the z gradient obtained in this way improves as more terms of degree 2p+1, p=1, 2, etc. of the expansion are cancelled. This no longer depends on considerations of symmetry but on the actual distribution of the currents in the individual source.

In a simple embodiment of the individual source based on coaxial solenoidal coils, with a minimum of two solenoidal coils geometrically symmetrical relative to the plane xOy and carrying opposite currents, their dimensions and their positions can be chosen to cancel $Z_3$, the first term governing linearity defects then being $Z_5$. With four solenoidal coils with appropriately chosen dimensions and positions, $Z_3$ and $Z_5$ can be cancelled, the first term governing linearity defects becoming $Z_7$, and so on.

In seeking to optimize this kind of generator, other considerations can be introduced such as minimizing the continuous power necessary to obtain a given permanent gradient or minimizing the inductance to allow shorter rise times with a given maximum voltage or adaptation to available power supplies or amplifiers. It is important to note that this production principle greatly facilitates use of a plurality of power supplies or amplifiers, thereby reducing their unit power.

The production in accordance with the same principles of an x gradient generator (for a y gradient generator the reasoning is the same with a rotation of π/2 about Oz) is equally possible and proves just as effective for obtaining the required linearity.

An even number N=2n of individual sources of type (AS) regularly arranged about the axis Oz must be used, the plane xOz being a plane of symmetry of the whole. This latter element of symmetry imposes that the origin azimuth $\phi_0$ be O or $$\frac{\pi}{2n}.$$

The coordinates of the traces $O'_j$ of their axes on the plane xOy are therefore:

$$\varphi_j = j\frac{\pi}{n}, \text{ i.e. } \varphi_j = \frac{\pi}{2n} + j\frac{\pi}{n} j \in [0, 2n-1].$$

It is then shown that if the individual sources are energized by currents $I_j = I \cos \phi_j$, the expansion in spherical harmonics of the component z of the total field produced for a total dissipated power equal to nP reduces to:

$$B_z(r,\theta,\varphi) = n \begin{bmatrix} \sum_{p=0}^{\infty} r^{2p+1} X_{2p+1}^1 \cos\varphi W_{2p+1}^1 P_{2p+1}^1(\cos\theta) + \\ \left[\frac{1}{(-1)^k}\right] \sum_{k=1}^{\infty}\sum_{l=0}^{\infty} r^{2kn-1+2l} X_{2kn-1+2l}^{2kn-1} \cos(2kn-1) \\ \varphi W_{2kn-1+2l}^{2kn-1} P_{2kn-1+2l}^{2kn-1}(\cos\theta) + \left[\frac{1}{(-1)^k}\right] \\ \sum_{k=1}^{\infty}\sum_{l=0}^{\infty} r^{2kn+1+2l} X_{2kn+1+2l}^{2kn+1} \cos(2kn+1) \\ \varphi W_{2kn+1+2l}^{2kn+1} P_{2kn+1+2l}^{2kn+1}(\cos\theta) \end{bmatrix}$$

The calculation is similar to that described above with the following sums to be calculated:

$$\sum_{j=0}^{2n-1} \cos\varphi_j \cos m\varphi_j = \begin{cases} 0, m \neq 2kn \pm 1 \\ \left[\frac{1}{(-1)^k}\right], m = 2kn \pm 1 \end{cases}$$

$$\sum_{j=0}^{2n-1} \cos\varphi_j \sin m\varphi_j = 0 \forall m$$

The factor $(-1)^k$ corresponds to the origin azimuth being $$\frac{\pi}{2n}.$$

As for the z gradient, it suffices to choose N=2n (n being an integer) large enough for the contributions of the terms in $r^{2kn\pm1+2l} X_{2kn\pm1+2l}^{2kn\pm1}$ to be entirely negligible and for the expansion to reduce to:

$$B_z(r,\theta,\varphi) \approx n\sum_{p=0}^{\infty} r^{2p+1} X_{2p+1}^1 \cos\varphi W_{2p+1}^1 P_{2p+1}^1(\cos\theta)$$

$$= nX_1^1 x + n\sum_{p=1}^{\infty} r^{2p+1} X_{2p+1}^1 \cos\varphi W_{2p+1}^1 P_{2p+1}^1(\cos\theta)$$

The linearity of the x gradient generator obtained in this way increases as more terms of degree 2p+1, p=1, 2, etc. of the expansion are cancelled. This no longer depends on considerations of symmetry but on the actual distribution of the currents in the individual source.

In a simple embodiment of the individual source based on coaxial solenoidal coils, with a minimum of only one solenoidal coil, none of the coefficients $X_{2p+1}^1 \forall p \geq 1$ can be cancelled. At least two solenoidal coils symmetrical relative to the plane xOy and their dimensions and their positions can be chosen to cancel $X_3^1$, the first term governing linearity defects then being $X_5^1$. With three solenoidal coils with appropriately chosen dimensions and positions, $X_3^1$ and $X_5^1$ can be cancelled, the first term governing linearity defects then being $X_7^1$, and so on.

As for the z gradient generator, optimizing the system involves considering the continuous dissipated power and the inductance. Although for the former there could be only one power supply with all the individual sources in series, since the current would be the same for all, here at least as many supplies will be needed (in absolute value) as there are different current values.

Another very important aspect of this kind of device is that the same individual sources can produce the x gradient and the y gradient without it being necessary to install two physically separate sets as in prior art systems, in particular those described in the document U.S. Pat. No. 5,530,355.

Thus each individual source is energized by the algebraic sum of the currents necessary for the simultaneous production of two required gradient values, using the above formulas. However, note that although the currents and gradients add algebraically, the same does not apply to the dissipated powers, which it is important to calculate for each individual source as a function of the gradient sequences to be produced.

As the values of the x and y gradients must be controlled separately, in the end at least n separate power supplies are required, i.e. one power supply for each pair of individual sources antisymmetrical relative to the Oz axis.

Finally, for the best use of the limited space available for the gradient generators, the same number of individual sources can be adopted firstly for the x and y gradients, and secondly for the z gradient, by producing a composite individual source (AS) and (AA). In a simple implementation of an individual source of this kind based on coaxial solenoidal coils, it is possible for example to combine two solenoidal coils, symmetrical relative to the plane xOy, with dimensions and positions appropriately chosen to cancel $X_3^1$, and four solenoidal coils, antisymmetrical two by two relative to the plane xOy, on either side of each of the previous two solenoidal coils, with dimensions and positions appropriately chosen to cancel $Z_3$ and $Z_5$.

FIG. 2 shows that, for an X gradient, in order to energize the gradient coils an electronic circuit 43 produces a temporal pulse 44 having a shape (rise time, fall time) and a duration required by an imaging sequence to be used with the NMR machine. The signal 44 representing the pulse is introduced into a variable gain controlled amplifier 45.

A data processing system that manages the sequences causes the amplifier 45 to apply a nominal current multiplied by a coefficient which here has the value 1 for the coils situated in a tube 46 situated in the plane xOz.

A tube 47 contiguous with the tube 46 whose axis, here the axis 12, is situated in a plane passing through the axis z and inclined at π/6 relative to the plane xOz, is energized by a current multiplied by a coefficient having the value √3/2. For a tube 48 contiguous with the tube 47 and again offset therefrom by π/6, the current is multiplied by ½. For a tube 49 contiguous with the tube 48 and situated in a plane yOz, the coefficient has the value 0. For a tube 50 symmetrical with the tube 48, the coefficient has the value −½, for a tube 51 symmetrical with the tube 47, it has the value −√3/2, and for a tube 52 symmetrical with the tube 46 relative to the axis Z, the coefficient has the value −1. For tubes on the left in the figure and symmetrical to the tubes 46 to 52 relative to the plane xOz, the values of the coefficients are the same (negative below the axis Y, positive above the axis Y).

The current in a coil is therefore proportional to the cosine of the angle identifying the tube on the perimeter of the circular space that contains it. In one embodiment this distribution of the currents can equally be offset by 15°.

Figure 3:
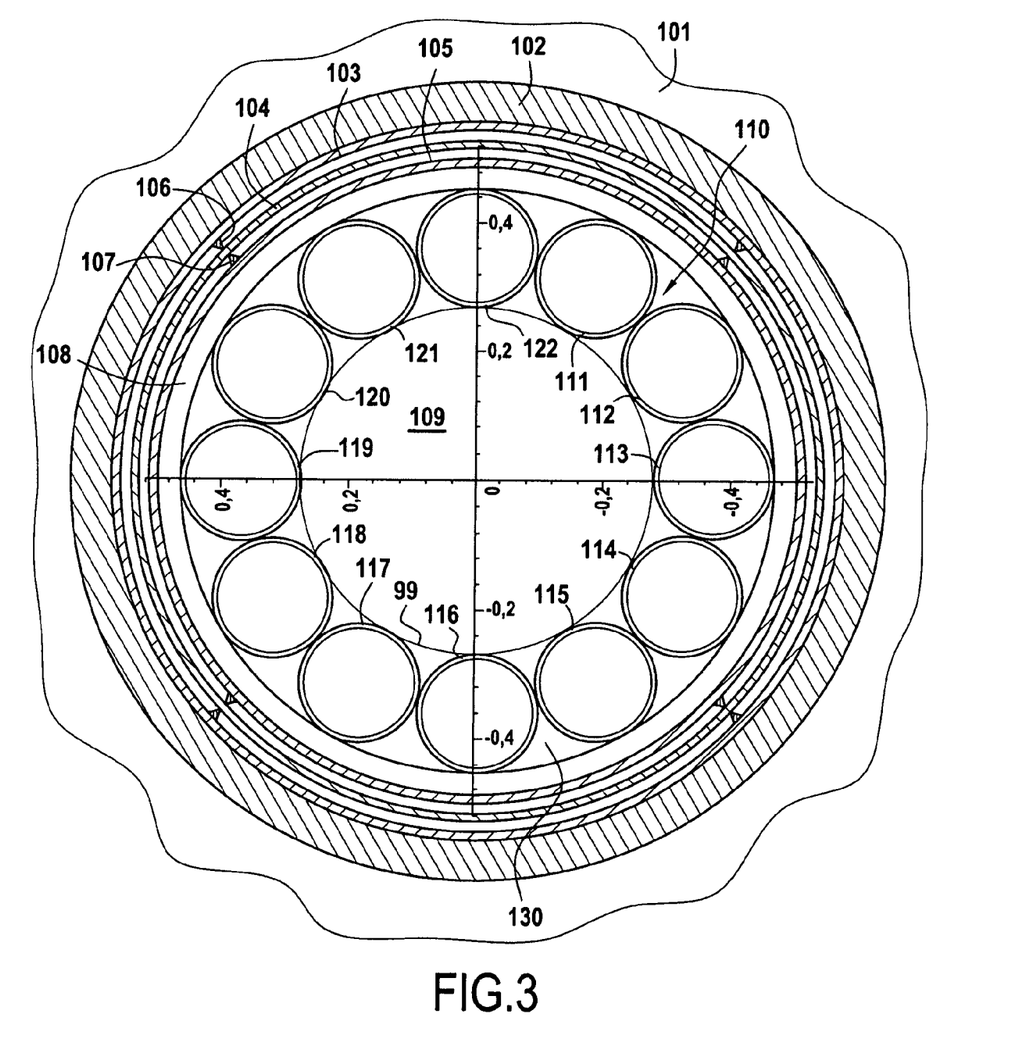
FIG. 3 is a diagram showing an NMR machine of the invention in section perpendicular to the axis of the tunnel.

FIG. 3 shows one particular embodiment of the invention in which, between the internal wall, for example of stainless steel, of the exterior cryogenic enclosure 102 incorporating the device 101 for creating the main magnetic field $B_0$ and the wall 99 defining a usable interior space 109 in the form of a tunnel intended to receive a patient and with the axis Z, there are found not only a cylindrical annular space 130 intended to receive a set 110 of solenoidal gradient coils 111 to 122 contained in tubes with axes parallel to the axis z and that can be produced in the manner described above, but also a cylindrical screen 104 with axis Z extending a great distance along the machine and comprising a conductive material of low resistance and low magnetoresistance.

To be more precise, the electrical conductivity, length and thickness of the cylindrical screen 104 are chosen so that negligible induced currents are generated in the exterior cryogenic enclosure 102 while the eddy currents induced in the cylindrical screen 104 itself are controlled, can be accurately calculated and contribute to reinforcing the gradients produced by the circular gradient coils 111 to 122.

The cylindrical screen 104 with axis Oz symmetrical relative to the plane xOy must be sufficiently long and thick and a sufficiently good conductor for the residual electrical fields outside it to produce only entirely negligible induced currents in the cryogenic panels 102. The conductivity of the material used must also be relatively high so that diffusion of induced currents in the screen during characteristic gradient variation times is negligible, in order in particular for the currents established by a rising gradient to disappear almost entirely when it falls.

In practice this imposes the choice of a screen made of superconductor material, copper or aluminum cooled at least to the temperature of liquid nitrogen (77 K) or better still to a lower temperature (20 K to 40 K, for example). Aluminum is then found to be a better choice than copper because of its lower magnetoresistance. The minimum screen thickness necessary is linked to the skin thickness corresponding to the gradient variation characteristic times. In practice, this skin thickness is sufficiently small for mechanical strength considerations to be decisive in the choice of the thickness of the screen. That thickness can be in the range 5 mm to 15 mm, for example.

In one particular embodiment the cylindrical screen 104 made of conductive material is disposed between first and second cylindrical glassfiber-reinforced epoxy walls 103, 105. The screen 104 is held in position relative to the cylindrical walls 103, 105 by localized insulative supports 106, 107.

It is important to note that the resulting screen 104 has the symmetry properties necessary for all the conclusions indicated above to remain applicable to the coefficients of the spherical harmonics expansion which are zero because of geometrical symmetry and the relations between the currents from the individual sources. For a sufficiently large number of those sources, the linearity of the gradients therefore depends only on coefficients $Z_{2p+1}$ for the z gradient, $_{2p+1}^1$ for the x or y gradients (p≧1), which coefficients must obviously be calculated taking account of the field generated by the eddy currents. These currents are simple to calculate for the z gradient because the geometry of the induced currents is known a priori. For the x or y gradients, where this is not true, known electromagnetic calculation techniques are used (finite differences, finite elements, spectral methods, etc.).

In a simple embodiment of an individual source based on coaxial solenoidal coils, like those described in the present application or in patent document WO 2005/029110, i.e. consisting of circular solenoidal coils of diameter that is inscribed within the thickness of the cylindrical annular space and of axis that is parallel to the main field, the currents induced in the screen 104 contribute to reinforcing the gradients produced and to increasing very significantly the efficiency of the system. In contrast, for conventional implementations that produce X or Y gradients using standard gradient coils like those described for example in patent document FR 2 588 997, instead of solenoidal gradient coils 111 to 122 placed in tubes, the currents that would be induced in a screen like the screen 104 would tend to reduce the gradients produced.

Figure 6A:
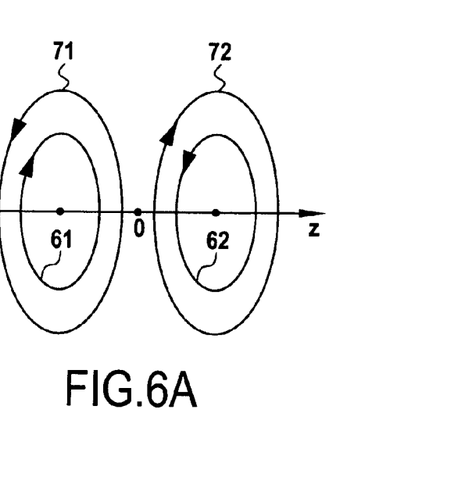
FIG. 6A is a diagram showing the influence of the eddy currents on two prior art turns in the Maxwell position with axis Oz.
Figure 6B:
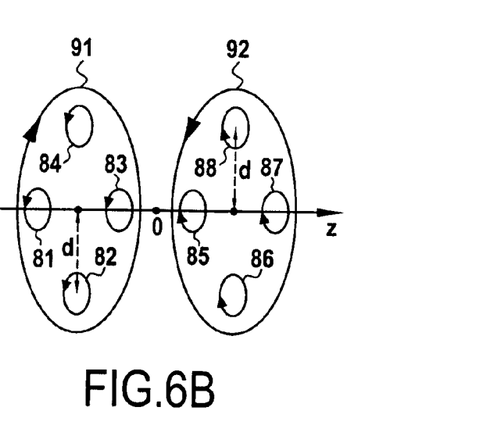
FIG. 6B is a diagram showing the influence of the eddy currents on a set of turns according to the invention with their axis parallel to the axis Oz but at a certain distance therefrom.

To illustrate this comparison, consider a Z gradient and two turns 61, 62 represented in FIG. 6A in the Maxwell position around an axis Oz of a conventional implementation and two sets of turns 81 to 84 and 85 to 88 represented in FIG. 6B regularly arranged around an axis Oz but each having an axis parallel to Oz and situated at a distance $\underline{d}$ from that axis Oz to create a Z gradient by the method according to the invention.

In FIG. 6A, the references 71, 72 designate induced current field lines created in a standard conductive screen disposed around the Maxwell turns 61, 62.

In FIG. 6B, the references 91, 92 designate induced current field lines created in a conductive screen disposed around turns 81 to 84 and 85 to 88 in accordance with the invention.

The arrows in FIGS. 6A and 6B indicate the direction of flow of the currents in the gradient coils and the induced current field lines.

Note that, in contrast to the prior art, the induced currents 91, 92 in a screen of a device of the invention, such as the screen 104, tend to reinforce the gradients produced by the gradient turns 81 to 88, because the induced current lines 91, 92 then behave like additional Maxwell coils.

More particularly, FIG. 6A shows the two turns 61, 62 with axis Oz in the Maxwell position: the turn 62 situated on the z>0 side carries a current turning in the forward direction about Oz and increasing with time, whereas the turn 61 situated on the z<0 side carries a current of the same absolute value but in the opposite direction. Under these conditions, these two turns 61, 62 create, in the vicinity of the center O, a gradient $$\frac{\partial \beta_z}{\partial z} > 0$$

increasing in time. The circles 71, 72 with axis Oz and of greater diameter than the Maxwell turns 61, 62 represent the induced current field lines and applying Faraday's law $$e = -\frac{d\phi}{dt}$$

to each of the close circuits 71, 72 produces, like Lenz's law, of course, eddy currents in the opposite direction to those of the closest generator turn 61, 62, which currents therefore reduce the gradient that the two Maxwell turns 61, 62 would produce on their own.

In the FIG. 6B diagram showing the system of the present application, the generator turns 81 to 88 have a smaller diameter than the above Maxwell turns 61, 62, their axes are parallel to the axis Oz, but at a certain distance d therefrom, and they are regularly distributed as explained above. Only four turns 81 to 84 and 85 to 88 are shown on each side for clarity. To obtain a gradient $$\frac{\partial \beta_z}{\partial z} > 0$$

as before, the generator currents must now turn in the reverse direction on the z>0 side and in the forward direction on the z<0 side. When their absolute values cross, Lenz's law predicts, in the diagrammatic closed circuits 91, 92 representing the eddy currents, a current in the forward direction on the z>0 side and a current in the reverse direction of the z<0 side, these currents making a positive contribution to the gradient, i.e. reinforcing the source gradient.

In a machine of the invention, a passive screen is thus used which, in combination with solenoidal gradient coils off-center relative to the axis Oz, use the eddy currents to reinforce the gradients rather than to reduce them.

The conductive screen is cooled to a sufficiently low temperature for the eddy currents to suffer virtually no attenuation between the rising edge and the falling edge of the gradient pulse.

Finally, the contribution of the eddy currents to the total gradient produced can be calculated with great accuracy, enabling excellent linearity to be achieved for this gradient.

As indicated above, for the system to function correctly under the conditions in which it is used, the resistivity ρ of the material of the cylindrical screen of radius $\underline{a}$ must be sufficiently low for it to be possible to neglect the attenuation of the eddy currents over the time interval Δt in which the gradient concerned is established during the imaging sequence (these intervals are variable but typically of the order of a few milliseconds with rise times and fall times of the order of 100 microseconds). It can be shown that the requirement $$\rho << \frac{\mu_0 a^2}{\Delta t}$$

must apply, which results in resistivities of the order of $10^{-9}$ Ω·m. At room temperature, the resistivity of aluminum is higher than that of copper, substantially equal to 100% IACS ($1.7241 \times 10^{-8}$ Ω·m), but falls more quickly with temperature and, at 50 K, the resistivities of copper and aluminum are the same, at $0.5 \times 10^{-9}$ Ω·m, which is the required value. However, this screen is subjected to the main field $B_0$, which reaches a field strength of several teslas in high-field machines, and the resistivity of metals increases with the field. This magnetoresistance phenomenon is stronger in copper, whose resistivity increases virtually linearly with the field (hence its use in magnetometers) whereas, with aluminum, the phenomenon is subject to "saturation" in this range, hence its benefit in the proposed application.

A screen made of a superconductor material (ρ=0) also constitutes an ideal solution if it is designed to withstand the high main field and the fast variations of the gradient field.

As indicated above, the invention can be applied to NMR machines in which the gradient coils 111 to 122 are such that a circular solenoidal coil whose diameter is inscribed within the annular cylindrical space 130 and that produces a field gradient $\underline{z}$ in a first direction $\underline{z}$ is coaxial with another solenoidal coil inscribed in the same tube in this annular cylindrical space 130 and producing a field gradient X in an inclined direction $\underline{x}$ relative to the direction $\underline{z}$.

The invention can nevertheless be applied in the same way to NMR machines in which only the solenoidal gradient coils 111 to 122 producing field gradients X, Y in directions perpendicular to the direction z are disposed in tubes within the thickness of the annular cylindrical space 130, while a more standard solution is adopted for the production of the field gradient z whereby annular coils for producing a magnetic field gradient oriented along a generatrix of the machine are disposed on an external wall 108 of the annular space 130 and not within that space. The standard solutions for creating the field gradient Z have fewer drawbacks than those for creating the field gradients X, Y.

Figure 5:
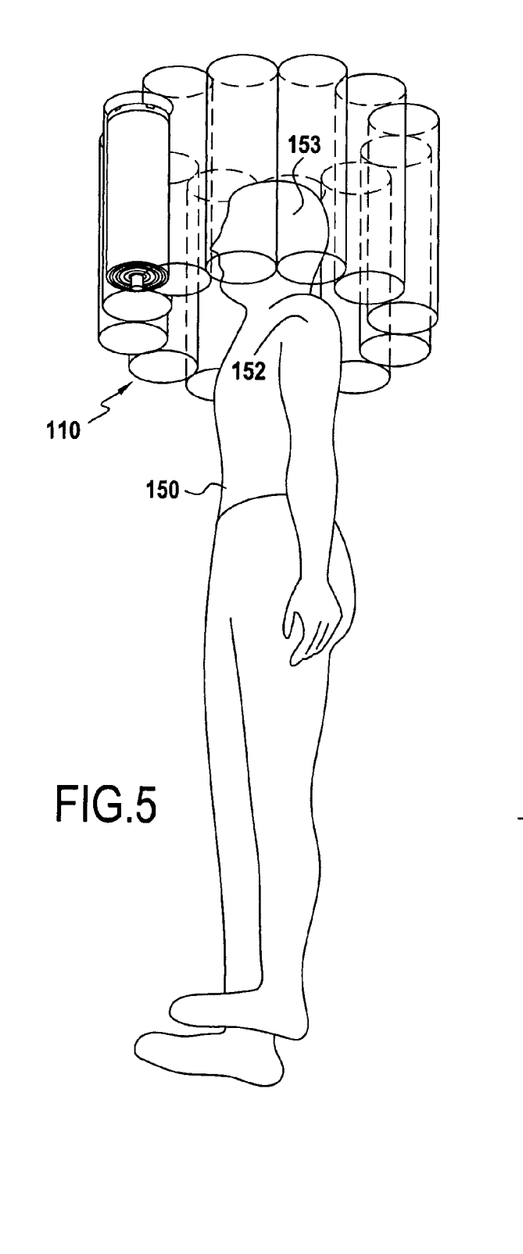
FIG. 5 is a diagrammatic perspective view showing an application to "head gradient" examination.

The efficiency $$\frac{G}{\sqrt{P}}$$

of the gradient generators under steady state conditions (where G is the field gradient produced for a dissipated power P) increases as the source currents approach the volume of interest. The inductance is also reduced if the dimensions of the generator are smaller. This is why specific systems are produced for imaging the brain, known as "head gradients", with dimensions much smaller than those for "whole body gradients". FIG. 5 shows diagrammatically an example with a patient 150 with only their head 153 inserted into the volume of interest in which the set 110 of gradient coils operates. Certain contradictions between the geometrical constraints resulting both from the Maxwell equations, and from the morphology of the human body, could be eliminated if space were freed up for the passage of the shoulders 151, 152 of the person to be examined. It is assumed that this person is placed so that they are stretched out along the axis Oz and the "axis" of their shoulders is in the plane xOz and parallel to Ox.

In order to provide a free passage for the shoulders 151, 152, a configuration of the gradient generators is considered with N=2n individual sources of origin azimuth $\phi_0 0$ in which the two individual sources corresponding to $\phi_j 0$ and $\phi_j = \pi$ are eliminated. It is then still possible to find combinations of individual source currents that yield the best possible linearity with an acceptable reduction of efficiency.

When the z gradient generator consists of circular solenoidal coils placed in the annular space 130, starting from a configuration with N=2n individual sources with $\phi_0 =$, one source in two is eliminated.

If the integer number n is sufficiently large, linearity is always governed by the structure of the individual source. The efficiency $$\frac{G}{\sqrt{P}}$$

is merely divided by $\sqrt{2}$.

This being so, room has been provided not only for the shoulders 151, 152 of the patient, but also in other directions, which correspond to the other sources eliminated, which can have a benefit in terms of accessibility or accommodating ancillaries.

Where the x and y gradient generator consisting of circular solenoidal coils placed in the annular space 130 is concerned, a distinction must be drawn between two cases according to whether n is even or odd.

n even

If n=2υ, the solution is the same as for the z gradient. If υ is sufficiently large, linearity is always governed by the structure of the individual source and the efficiency $$\frac{G}{\sqrt{P}}$$

is merely divided by $\sqrt{2}$.

n odd n=2υ+1 implies effectively eliminating only the two individual sources corresponding to the passage of the shoulders, and new relations between the currents from the remaining sources must be established. It will nevertheless be noted that for the y gradient nothing has changed compared to the situation with no elimination of sources since the two individual sources eliminated were not energized at that time. The linearity and the efficiency of this y gradient are therefore preserved.

For the x gradient the following aspects must be taken into account: the coordinates of the traces $O'_j$ of the axes of the additional sources in the xOy plane are now $$\varphi_j = j\frac{\pi}{2\upsilon+1} j \in [1, 2\upsilon] \cup [2\upsilon+2, 4\upsilon+1]$$

and the best possible linearity is obtained with currents:

$$I_j = I[\cos \phi_j - (-1)^j]$$

The calculations replace $\cos \phi_j$ with $\cos \phi_{j-(-1)^j}$ in the sums to be calculated and taking into account the fact that the summation over j can be extended, from 0 to 2n−1=4υ+1 since j=0 and j=2υ+1 corresponding to the individual sources eliminated yield $\cos \phi_j - (-1)^j = 0$.

Thus, with a dissipated power equal to 3nP:

$$B_z(r, \theta, \varphi) = n \begin{bmatrix} \sum_{p=0}^{\infty} r^{2p+1} X_{2p+1}^1 \cos\varphi W_{2p+1}^1 P_{2p+1}^1 (\cos\theta) - \\ 2\sum_{k=1}^{\infty}\sum_{l=0}^{\infty} r^{(2k-1)n+2l} X_{(2k-1)n+2l}^{(2k-1)n} \cos(2k-1) \\ n\varphi W_{(2k-1)n+2l}^{(2k-1)n} P_{(2k-1)n+2l}^{(2k-1)n}(\cos\theta) + \\ \sum_{k=1}^{\infty}\sum_{l=0}^{\infty} r^{2kn-1+2l} X_{2kn-1+2l}^{2kn-1} \cos(2kn-1) \\ \varphi W_{2kn-1+2l}^{2kn-1} P_{2kn-1+2l}^{2kn-1}(\cos\theta) + \\ \sum_{k=1}^{\infty}\sum_{l=0}^{\infty} r^{2kn+1+2l} X_{2kn+1+2l}^{2kn+1} \cos(2kn+1) \\ \varphi W_{2kn+1+2l}^{2kn+1} P_{2kn+1+2l}^{2kn+1}(\cos\theta) \end{bmatrix}$$

The linearity is therefore worse than that of the y gradient with new non-zero terms in $X_{(2k-1)n+2l}^{(2k-1)n}$, in particular that of the lowest degree $X_n^n$, but it suffices to make n large enough in order to guarantee the required quality. The efficiency under permanent conditions is merely divided by $\sqrt{3}$.

There is therefore a choice between two possible configurations that provide accessibility at the level of the shoulders 151, 152 of a patient.

The individual sources can be rated as though there were to be provided a number of them that is a multiple of 4, N=4υ, and in fact only one in two, i.e. 2υ, installed. This solution is valid for the gradients in the three directions and for each of them reduces the efficiency by a factor $\sqrt{2}$ compared to the situation that would apply if N=4υ sources had been installed, and allows use of combined individual sources for the axes x, y and z.

The individual sources can also be rated as though a number N=4υ+2 of them were to be imposed and in fact only 4υ (references 211 to 222 in FIG. 4) installed by eliminating the two individual sources corresponding to the passage of the shoulders 151, 152 in the plane xOz. The y gradient is then identical to what would have been obtained with all the sources whereas the x gradient has its efficiency reduced by a factor $\infty\sqrt{3}$. There is no solution of this type for the z gradient, which under these conditions must be installed in a space external to that occupied by the set 210 of previous sources and therefore requires no further particular arrangements for the passage of the shoulders.

Figure 4:
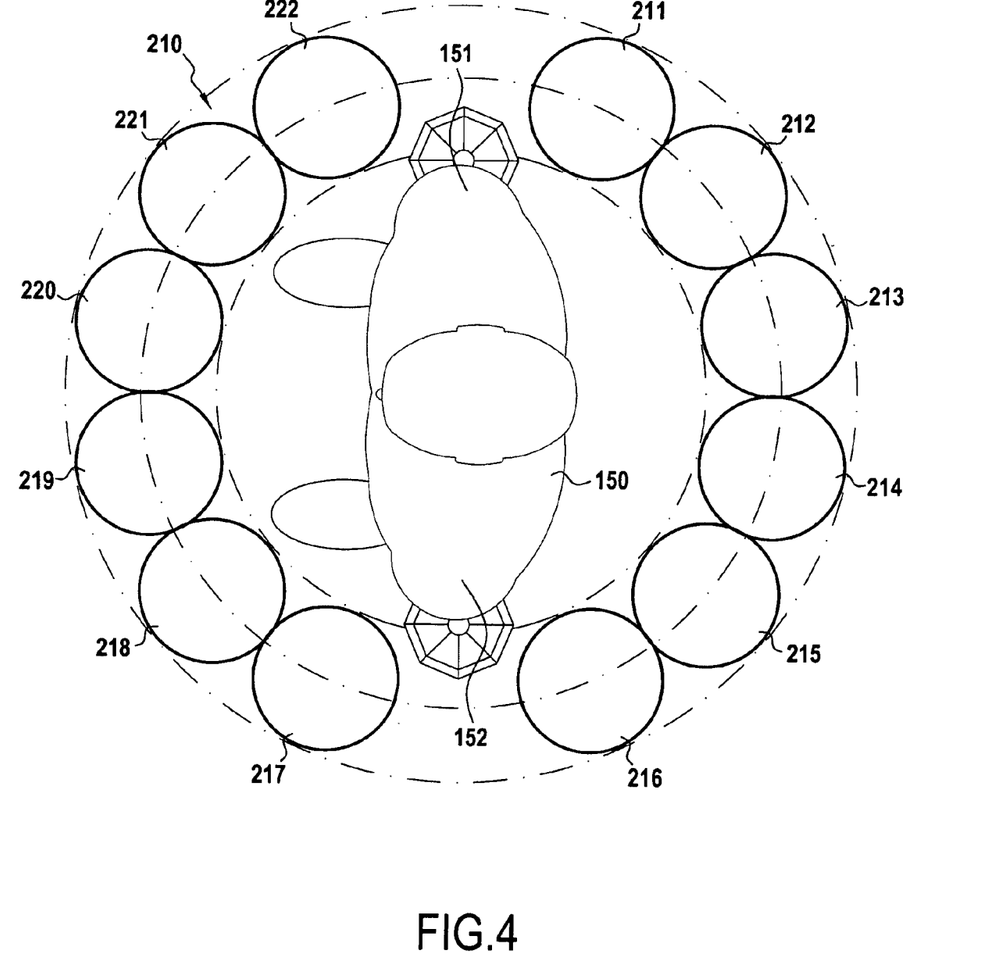
FIG. 4 is a diagram showing part of an NMR machine of the invention adapted to free up localized space in section perpendicular to the axis of the tunnel.

For clarity, the cylindrical screen 106 and the associated components are not shown in FIG. 4, but can be produced in the same way as shown in FIG. 3.

The invention claimed is:

1. A nuclear magnetic resonance machine comprising means for creating an intense main magnetic field $B_0$ in a usable interior space in the form of a tunnel with axis Z, means for radio-frequency excitation and for processing radio-frequency signals emitted in response by a body or object placed in said usable interior space, and a set of solenoidal gradient coils for superimposing on the intense magnetic field $B_o$ components of a additional magnetic field, said gradient coils being incorporated into tubes disposed in an annular cylindrical space situated between an exterior cryogenic enclosure containing said means for creating an intense magnetic field $B_0$ and said usable interior space, the diameter of the gradient coils being inscribed in a thickness of said annular cylindrical space, the solenoidal gradient coils being adapted to produce a first field gradient X in a first radial direction (x) of the machine perpendicular to the axis Z and a second field gradient Y in a second radial direction (y) of the machine also perpendicular to the axis Z, the first direction (x) being perpendicular to the second direction (y), and the machine including amplifiers for simultaneously energizing said solenoidal coils with algebraic sums of currents corresponding to the two gradients, characterized in that a solenoidal coil whose diameter is inscribed in the cylindrical annular space and that produces a field gradient Z in a direction (z) parallel to the main field $B_0$ is coaxial with another solenoidal coil inscribed in the same tube of this annular cylindrical space and producing a field gradient X in a direction (x) perpendicular to the direction (z), in that it further comprises between said exterior cryogenic enclosure and said annular cylindrical space a cylindrical screen along the axis Z comprising a conductive material cooled to a temperature less than or equal to 77 K and chosen to have resistivity less than or equal to $10^{-8}$ Ω·m such that negligible induced currents are generated in the exterior cryogenic enclosure while the eddy currents induced in the cylindrical screen contribute to reinforcing the gradients produced by said solenoidal gradient coils.

2. A machine according to claim 1, characterized in that the cylindrical screen is made of a material selected from the group consisting of aluminum, copper, and a superconductor material.

3. A machine according to claim 1, characterized in that the cylindrical screen is cooled to a temperature in the range 20 K to 40 K.

4. A machine according to claim 1, characterized in that the cylindrical screen of conductive material is disposed between first and second cylindrical glassfiber-reinforced epoxy walls, the cylindrical screen being held in position relative to the first and second cylindrical walls with the aid of localized insulative supports.

5. A machine according to claim 1, characterized in that the cylindrical screen has a thickness in the range 5 mm and 15 mm.

6. A machine according to claim 1, characterized in that the solenoidal gradient coils incorporated in tubes constitute individual sources of X, Y and Z gradients that are dimensioned as forming part of a set of N contiguous individual sources distributed at the perimeter of the cylindrical annular space, where N =4υ, υ being an integer greater than or equal to 2, but where one in two individual sources is omitted so as to retain only 2υ non-contiguous individual sources, each tube being provided with one individual source.

7. A machine according to claim 1, characterized in that the solenoidal coils are distributed at the perimeter of the annular space in 2n arrangements of coaxial solenoidal coils where n is an integer greater than or equal to 3.

8. A machine according to claim 1, characterized in that the solenoidal coils are distributed at the perimeter of the annular space in 2n arrangements of coaxial solenoidal coils, n being an integer greater than or equal to 3, a plurality of coils being energized simultaneously by combinations of currents to produce a X and/or Y and/or Z gradient.

9. A machine according to claim 8, characterized in that a component of a current that flows in a coil to produce a gradient is proportional to a nominal current multiplied by the cosine of an angle that identifies the coil on the perimeter of the annular space.

10. A machine according to claim 1, characterized in that the annular space includes contiguous tubes distributed at the perimeter to receive the solenoidal coils, the radius a of a tube being given by a=r1(sin π/N)/(1−sin π/N)=r2(sin π/N)/(1+sin π/N), in which formula N represents the number of tubes and r1 and r2 the inside and outside radii, respectively, of the annular space.

11. A machine according to claim 1, characterized in that the solenoidal coils are energized by individual electrical power supplies.

12. A machine according to claim 1, characterized in that the solenoidal coils are formed of elongate helicoidal turns along circular conductive sleeves, sleeves of the same coil being concentric and engaged one within another.

13. A machine according to claim 12, characterized by an annular space for cooling fluid between two sleeves.

14. A machine according to claim 2,
  characterized in that the cylindrical screen is cooled to a temperature in the range 20 K to 40 K;
  characterized in that the cylindrical screen of conductive material is disposed between first and second cylindrical glassfiber-reinforced epoxy walls, the cylindrical screen being held in position relative to the first and second cylindrical walls with the aid of localized insulative supports; and
  characterized in that the cylindrical screen has a thickness in the range 5 mm and 15 mm.

15. A machine according to claim 5,
  characterized in that the solenoidal gradient coils incorporated in tubes constitute individual sources of X, Y and Z gradients that are dimensioned as forming part of a set of N contiguous individual sources distributed at the perimeter of the cylindrical annular space, where N =4υ, υ being an integer greater than or equal to 2, but where one in two individual sources is omitted so as to retain only 2υ non-contiguous individual sources, each tube being provided with one individual source;

characterized in that the solenoidal coils are energized by individual electrical power supplies;

characterized in that the solenoidal coils are formed of elongate helicoidal turns along circular conductive sleeves, sleeves of the same coil being concentric and engaged one within another; and characterized by an annular space for cooling fluid between two sleeves.

16. A machine according to claim 5, characterized in that the solenoidal coils are distributed at the perimeter of the annular space in 2n arrangements of coaxial solenoidal coils where $\underline{n}$ is an integer greater than or equal to 3;

characterized in that the solenoidal coils are energized by individual electrical power supplies;

characterized in that the solenoidal coils are formed of elongate helicoidal turns along circular conductive sleeves, sleeves of the same coil being concentric and engaged one within another; and characterized by an annular space for cooling fluid between two sleeves.

17. A machine according to claim 5, characterized in that the solenoidal coils are distributed at the perimeter of the annular space in 2n arrangements of coaxial solenoidal coils, $\underline{n}$ being an integer greater than or equal to 3, a plurality of coils being energized simultaneously by combinations of currents to produce a X and/or Y and/or Z gradient;

characterized in that a component of a current that flows in a coil to produce a gradient is proportional to a nominal current multiplied by the cosine of an angle that identifies the coil on the perimeter of the annular space;

characterized in that the solenoidal coils are energized by individual electrical power supplies;

characterized in that the solenoidal coils are formed of elongate helicoidal turns along circular conductive sleeves, sleeves of the same coil being concentric and engaged one within another; and characterized by an annular space for cooling fluid between two sleeves.

18. A machine according to claim 5, characterized in that the annular space includes contiguous tubes distributed at the perimeter to receive the solenoidal coils, the radius $\underline{a}$ of a tube being given by $a = r1(\sin \pi/N)/(1-\sin \pi/N) = r2(\sin \pi/N)/(1+\sin \pi/N)$, in which formula N represents the number of tubes and r1 and r2 the inside and outside radii, respectively, of the annular space;

characterized in that the solenoidal coils are energized by individual electrical power supplies;

characterized in that the solenoidal coils are formed of elongate helicoidal turns along circular conductive sleeves, sleeves of the same coil being concentric and engaged one within another; and characterized by an annular space for cooling fluid between two sleeves.

19. A machine according to claim 1, characterized in that the solenoidal coils are energized by individual electrical power supplies;

characterized in that the solenoidal coils are formed of elongate helicoidal turns along circular conductive sleeves, sleeves of the same coil being concentric and engaged one within another; and characterized by an annular space for cooling fluid between two sleeves.

20. A machine according to claim 12, characterized in that the solenoidal coils are formed of elongate helicoidal turns of rectangular profile.

21. A machine according to claim 15, characterized in that the solenoidal coils are formed of elongate helicoidal turns of rectangular profile.

22. A machine according to claim 16, characterized in that the solenoidal coils are formed of elongate helicoidal turns of rectangular profile.

23. A machine according to claim 17, characterized in that the solenoidal coils are formed of elongate helicoidal turns of rectangular profile.

24. A machine according to claim 18, characterized in that the solenoidal coils are formed of elongate helicoidal turns of rectangular profile.

25. A machine according to claim 19, characterized in that the solenoidal coils are formed of elongate helicoidal turns of rectangular profile.

\* \* \* \* \*

UNITED STATES PATENT AND TRADEMARK OFFICE
CERTIFICATE OF CORRECTION

PATENT NO. : 7,786,730 B2
APPLICATION NO. : 12/084082
DATED : August 31, 2010
INVENTOR(S) : Guy Aubert It is certified that error appears in the above-identified patent and that said Letters Patent is hereby corrected as shown below:

In the Specification:

Column 6, lines 35-39, reads as follows:

" $\begin{aligned} x &= r\sin\theta\cos\phi \\ y &= r\sin\theta\sin\phi \\ z &= r\cos\theta \end{aligned}$ "

Should read as follows:

-- $\begin{aligned} x &= r\sin\vartheta\cos\varphi \\ y &= r\sin\vartheta\sin\varphi \\ z &= r\cos\vartheta \end{aligned}$ --;

Column 6, line 61, " $|W_n^m P_n^m(\cos\theta)| \leqq 1$ " should read: -- $|W_n^m P_n^m(\cos\vartheta)| \leq 1$ --;

Column 8, lines 18 and 20, within the equations "≧" should read -- ≥ -- (in all three occurrences);

Column 8, lines 26 and 28, within the equations "≧" should read -- ≥ -- (all three occurrences);

Column 9, line 14, " $X_{kN+2+1}^{kN}$ " should read -- $X_{kN+2l+1}^{kN}$ --;

Column 9, line 20, " $N\sum_{i=0}^{n}$ " should read -- $N\sum_{p=1}^{n}$ --;

Column 9, line 47, " $\pi/2$ " should read -- $\dfrac{\pi}{2}$ --;

Column 10, line 39, "(n being an" should read -- (n being an --;

Signed and Sealed this
Thirteenth Day of August, 2013

Teresa Stanek Rea
*Acting Director of the United States Patent and Trademark Office*

CERTIFICATE OF CORRECTION (continued)

Column 10, line 41, "$X_{2kn\pm1+2l}^{2kn\pm1}$" should read -- $X_{2kn\pm1+2l}^{2kn\pm1}$ --;

Column 10, line 60, "$X_{2p+1}^{1} \forall p \geqq 1$" should read -- $X_{2p+1}^{1} \forall p \geq 1$ --;

Column 12, line 54, "$_{2p+1}^{1}$" should read -- $_{2p+1}^{1}$ --;

Column 12, line 55, "≧" should read -- ≥ --;

Column 12, line 57, "z" should read -- z --;

Column 13, line 64, "d" should read -- d --;

Column 15, line 43, "z" should read -- z --;

Column 16, line 56, "$X_{(2k-1)n+2l}^{(2k-1)n}$" should read -- $X_{(2k-1)n-2l}^{(2k-1)n}$ --;

Column 17, line 13, "factor $\infty\sqrt{3}$" should read -- factor $\sqrt{3}$ --;

In the Claims:

Column 18, claim 7, line 19, "2n" should read -- 2n --; and

Column 18, claim 8, line 23, "2n" should read -- 2n --.